(12) United States Patent
Wei et al.

(10) Patent No.: US 11,776,820 B2
(45) Date of Patent: Oct. 3, 2023

(54) VERTICAL INTERCONNECTION STRUCTURE AND MANUFACTURING METHOD THEREOF, PACKAGED CHIP, AND CHIP PACKAGING METHOD

(71) Applicant: HUAWEI TECHNOLOGIES CO., LTD., Guangdong (CN)

(72) Inventors: Xiaoyun Wei, Dongguan (CN); Yong Yang, Xi'an (CN); Chaojun Deng, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 26 days.

(21) Appl. No.: 17/459,919

(22) Filed: Aug. 27, 2021

(65) Prior Publication Data

US 2022/0102164 A1 Mar. 31, 2022

(30) Foreign Application Priority Data

Sep. 30, 2020 (CN) .......................... 202011066391.9
Dec. 10, 2020 (CN) .......................... 202011455250.6

(51) Int. Cl.
*H01L 21/48* (2006.01)
*H01L 21/56* (2006.01)
(Continued)

(52) U.S. Cl.
CPC .......... *H01L 21/486* (2013.01); *H01L 21/568* (2013.01); *H01L 21/6835* (2013.01); *H01L 23/49827* (2013.01); *H01L 24/11* (2013.01); *H01L 25/0652* (2013.01); *H01L 25/0655* (2013.01); *H01L 25/50* (2013.01); *H01L 24/73* (2013.01); *H01L 2221/68345* (2013.01);
(Continued)

(58) Field of Classification Search
CPC . H01L 21/486; H01L 21/568; H01L 21/6835; H01L 23/49827; H01L 24/11; H01L 25/0652; H01L 25/0655; H01L 25/50; H01L 24/73; H01L 2221/68345; H01L 2224/11002; H01L 2224/11462; H01L 2224/73204; H01L 23/15; H01L 23/147; H01L 23/5384
USPC ......................................... 438/109
See application file for complete search history.

(56) References Cited

U.S. PATENT DOCUMENTS 5,916,453 A 6/1999 Beilin et al.
8,016,628 B2 * 9/2011 Lee ....................... B32B 38/162
156/273.3
(Continued)

FOREIGN PATENT DOCUMENTS

EP 2958140 A1 12/2015
WO 2011155638 A1 12/2011
WO 2020010207 A1 1/2020

*Primary Examiner* — Vu A Vu
(74) *Attorney, Agent, or Firm* — WOMBLE BOND DICKINSON (US) LLP

(57) ABSTRACT

Embodiments of the application provide a vertical interconnection structure and a manufacturing method thereof, a packaged chip, and a chip packaging method. Conductive pillars are formed on a first surface of a substrate. A first insulated support layer wrapping the conductive pillars is formed on the first surface of the substrate. The conductive pillars are located in the first insulated support layer. An upper surface of the conductive pillar that is away from the substrate is not covered by the first insulated support layer. Then the substrate is removed.

17 Claims, 10 Drawing Sheets

(51) Int. Cl.
  *H01L 21/683*    (2006.01)
  *H01L 23/498*    (2006.01)
  *H01L 23/00*     (2006.01)
  *H01L 25/065*    (2023.01)
  *H01L 25/00*     (2006.01)

(52) U.S. Cl.
  CPC ............ *H01L 2224/11002* (2013.01); *H01L 2224/11462* (2013.01); *H01L 2224/73204* (2013.01)

(56) References Cited

U.S. PATENT DOCUMENTS

| | | | |
|---|---|---|---|
| 8,133,762 B2 * | 3/2012 | Pagaila | H01L 23/528 |
| | | | 438/117 |
| 8,445,323 B2 * | 5/2013 | Lin | H01L 23/5389 |
| | | | 257/532 |
| 8,836,142 B2 * | 9/2014 | Park | H01L 23/481 |
| | | | 257/E23.145 |
| 9,048,222 B2 * | 6/2015 | Hung | H01L 23/5384 |
| 9,177,925 B2 * | 11/2015 | Ashrafzadeh | H01L 25/16 |
| 10,037,975 B2 * | 7/2018 | Hsieh | H01L 23/28 |
| 10,157,829 B2 * | 12/2018 | Chen | H01L 24/19 |
| 10,269,773 B1 * | 4/2019 | Yu | H01L 24/14 |
| 10,283,474 B2 * | 5/2019 | Jeng | H01L 25/50 |
| 10,460,987 B2 * | 10/2019 | Liao | H01Q 1/2283 |
| 10,475,747 B2 * | 11/2019 | Yu | H01L 24/92 |
| 10,510,646 B2 * | 12/2019 | Lee | H01L 23/49838 |
| 10,720,388 B2 * | 7/2020 | Yu | H01L 21/6835 |
| 2018/0040546 A1 | 2/2018 | Yu et al. | |
| 2018/0190638 A1 | 7/2018 | Chen et al. | |
| 2018/0331041 A1 | 11/2018 | Liao et al. | |
| 2020/0083591 A1 | 3/2020 | Hsieh et al. | |
| 2020/0168550 A1 | 5/2020 | Ryu et al. | |
| 2020/0273804 A1 | 8/2020 | Jeon et al. | |

\* cited by examiner

VERTICAL INTERCONNECTION STRUCTURE AND MANUFACTURING METHOD THEREOF, PACKAGED CHIP, AND CHIP PACKAGING METHOD

CROSS-REFERENCE TO RELATED APPLICATIONS

This application claims priority to Chinese Patent Application No. 202011455250.6, filed on Dec. 10, 2020, which claims priority to Chinese Patent Application No. 202011066391.9, filed on Sep. 30, 2020. The disclosures of the aforementioned applications are hereby incorporated by reference in their entireties.

TECHNICAL FIELD

The application relates to the field of chip packaging technologies, and in particular, to a vertical interconnection structure and a manufacturing method thereof, a packaged chip, and a chip packaging method.

BACKGROUND

With development of fields such as the internet of things and artificial intelligence, an integration level of chips becomes increasingly high, making chip packaging technologies also constantly develop. Application of a three-dimensional packaging technology greatly improves the integration level of chips.

Vertical interconnection structures are usually used during three-dimensional packaging of chips. The vertical interconnection structure includes an insulated support layer and conductive pillars. The insulated support layer is plate-shaped, and has a plurality of through holes. The conductive pillars are located in the through holes. During packaging, two ends of the conductive pillar are respectively electrically connected to dies located on two sides of the insulated support layer or a package substrate.

When the vertical interconnection structure is manufactured, usually, the through holes are first manufactured in the insulated support layer, and then the conductive pillars are formed in the through holes in a manner such as electroplating. The through holes are usually formed by using a method of etching or a method of laser ablation. Side walls of through holes formed through etching are usually uneven. A process of laser ablation causes a relatively high local temperature, and a heat-affected region is formed in the insulated support layer. These problems all affect reliability of a packaged chip.

SUMMARY

Embodiments of the application provide a vertical interconnection structure and a manufacturing method thereof, a packaged chip, and a chip packaging method, to overcome problems in manufacturing a vertical interconnection structure in a related technology. The technical solutions are as follows:

An embodiment of the application provides a method for manufacturing a vertical interconnection structure. The manufacturing method includes:

forming conductive pillars on a first surface of a substrate; forming a first insulated support layer on the first surface, where the conductive pillars are located in the first insulated support layer, and an upper surface that is of the conductive pillar and that is away from the substrate is not covered by the first insulated support layer; and removing the substrate. The first insulated support layer is formed by at least one of the materials: amorphous silicon, polycrystalline silicon, silicon carbide, silicon nitride, boron nitride, silicon dioxide, aluminum nitride, and diamond. In some embodiments, the substrate is in the shape of a polygonal plate or a circular plate. The substrate has a first surface and a second surface that are opposite to each other, and a side surface that connects the first surface to the second surface. If the substrate is in the shape of a polygonal plate, the substrate has a plurality of side surfaces. If the substrate is in the shape of a circular plate, the substrate has one cylindrical side surface.

Based on the foregoing method, when the vertical interconnection structure is manufactured, the conductive pillars are formed before the first insulated support layer, so that when the first insulated support layer is formed, a material used for manufacturing the first insulated support layer directly wraps around the conductive pillars, to make the conductive pillars embedded in the first insulated support layer. Through holes do not need to be manufactured in the first insulated support layer in the manufacturing process, to avoid adverse impact caused by a process of manufacturing the through holes.

In some examples, when the first insulated support layer is formed, a thickness of an insulating supporting material that is formed on the first surface of the substrate is controlled, where the insulating supporting material is a material that forms the insulated support layer, so that the upper surface that is of the conductive pillar and that is away from the substrate is exposed out of the first insulated support layer, and is not covered by the first insulated support layer.

In some examples, a second insulated support layer is first formed on the first surface of the substrate, and then the second insulated support layer is thinned, to expose the upper surface that is of the conductive pillar and that is away from the substrate, thereby obtaining the first insulated support layer. The formed second insulated support layer completely covers the conductive pillars. When the second insulated support layer is formed, a thickness of the second insulated support layer does not need to be precisely controlled. Then the first insulated support layer is manufactured through thinning. A process difficulty is reduced.

For example, the second insulated support layer is thinned through polishing. Polishing starts from a surface that is of the second insulated support layer and that is away from the substrate, to reduce the thickness of the second insulated support layer, so that the upper surface that is of the conductive pillar and that is away from the substrate is exposed from the second insulated support layer.

In an embodiment, the thickness of the first insulated support layer is the same as a height of the conductive pillar, so that an end surface that is of the conductive pillar and that is away from the substrate is exactly flush with a surface that is of the first insulated support layer and that is away from the substrate.

In an embodiment, the first insulated support layer is formed by depositing one of the materials: amorphous silicon, polycrystalline silicon, silicon carbide, silicon nitride, boron nitride, silicon dioxide, aluminum nitride, and diamond.

In an embodiment, the conductive pillars are formed on the substrate by using a photoresist layer having a pattern as a mask.

In a possible implementation, a photoresist layer is formed on the first surface, where there are through holes in the photoresist layer. A conductive material is formed in the through holes, to form the conductive pillars. The photoresist layer located on the first surface is removed.

In the solution shown in an embodiment of the application, the photoresist layer is used as the mask, and the pattern of the photoresist layer includes the through holes that run through the photoresist layer. Due to existence of the through holes, the conductive pillars can be formed when the conductive material is formed in the through holes.

In an embodiment, the photoresist layer is formed for a plurality of times. Each time the photoresist layer is formed, the conductive material is formed in the through holes, to form the conductive pillars with a relatively large length-to-diameter ratio.

In some examples, a photoresist layer is formed again on a surface that is of the formed photoresist layer and that is away from the substrate, where through holes of the newly formed photoresist layer are in communication with the through holes of the formed photoresist layer. A conductive material is formed in the through holes of the newly formed photoresist layer, to lengthen the conductive pillars.

Based on the foregoing method, after the photoresist layer is formed on the first surface of the substrate to manufacture the conductive pillars, the photoresist layer is formed again, and the through holes of the newly formed photoresist layer are enabled to be in communication with the through holes of the formed photoresist layer. Then, the conductive material is formed in the through holes again, so that the length of the conductive pillar is increased. The process is repeated for a plurality of times. Even if the diameter of the conductive pillar is relatively small, the conductive pillar can be enabled to achieve a relatively large length.

In some examples, a length-to-diameter ratio of the conductive pillar is greater than 0 and is less than or equal to 20. A process in a related technology causes deficiencies of the conductive pillar, especially a conductive pillar with a relatively large length-to-diameter ratio. In addition, a larger length-to-diameter ratio indicates more serious deficiencies of the conductive pillar. Consequently, the length-to-diameter ratio of the conductive pillar is usually not greater than 8. Because the process of forming the through holes in the first insulated support layer is avoided, the deficiencies of the conductive pillar are avoided. In addition, the conductive pillar is constantly lengthened in the foregoing manner. A particular length is added each time, so that the length of the conductive pillar can reach 10 times or even more of the diameter of the conductive pillar.

In some examples, a minimum distance between the conductive pillars is 5 µm to 100 µm. In the related technology, due to limitation of precision of the process of forming the through holes in the insulated support layer, a minimum distance between through holes is relatively large, usually greater than or equal to 120 µm. This leads to a relatively large minimum distance between conductive pillars. In an embodiment of the application, precision of the process of manufacturing the photoresist layer is relatively high, and a minimum distance between the through holes of the photoresist layer can reach 20 µm or even less. Therefore, the minimum distance between the conductive pillars can be greatly reduced, to improve distribution density of the conductive pillars.

In a possible implementation, before the first insulated support layer is formed, a barrier layer is first formed on the conductive pillar, where the barrier layer covers a surface of the conductive pillar. The conductive pillar is usually metallic, for example, copper. The first insulated support layer is formed by one of the materials: amorphous silicon, polycrystalline silicon, silicon carbide, silicon nitride, boron nitride, silicon dioxide, aluminum nitride, and diamond. The barrier layer can separate the conductive pillar from the first insulated support layer, to prevent diffusion between a metallic material that forms the conductive pillar and an insulating supporting material that forms the first insulated support layer, thereby avoiding adverse impact.

In a possible implementation, after the barrier layer is formed and before the first insulated support layer is formed, a dielectric layer is first formed on the conductive pillar, where the dielectric layer covers the barrier layer. The dielectric layer has relatively high resistance, and can implement a function of insulation.

In an embodiment, the barrier layer and the dielectric layer are both formed through deposition.

In some examples, a material that forms the barrier layer is silicon nitride. The barrier layer formed by using silicon nitride as the material can have both functions of preventing diffusion and preventing current leakage, so that the structure of the dielectric layer can be omitted.

An embodiment of the application provides a vertical interconnection structure. The vertical interconnection structure is manufactured by using embodiments of the manufacturing method as described herein.

An embodiment of the application provides a chip packaging method. The chip packaging method includes:

forming conductive pillars on a first surface of a substrate; forming a first insulated support layer on the first surface, where the conductive pillars are located in the first insulated support layer; disposing a first die on a surface that is of the first insulated support layer and that is away from the substrate after the first insulated support layer is formed; and removing the substrate after the first die is disposed in a first redistribution layer. Based on the foregoing method, after the substrate is removed, one end that is of the conductive pillar and that is away from the first die is exposed, so that the first die can be connected to a package substrate, a printed circuit board, or another die by using the conductive pillars.

In an embodiment, in the chip packaging method, before the first insulated support layer is formed, a barrier layer is first formed on the conductive pillar.

In some embodiments, after the barrier layer is formed and before the first insulated support layer is formed, a dielectric layer is formed on the conductive pillar.

In some embodiments, the disposing a first die on a surface that is of the first insulated support layer and that is away from the substrate includes the following operations:

forming a first redistribution layer on the surface that is of the first insulated support layer and that is away from the substrate, where a first metal layer in the first redistribution layer is electrically connected to the conductive pillar; and disposing the first die on a surface that is of the first redistribution layer and that is away from the first insulated support layer, where the first die is electrically connected to the first metal layer. Based on the foregoing method, the first redistribution layer is formed to provide basis for subsequently disposing the first die. The first metal layer in the first redistribution layer is used for connecting the first die to the conductive pillar, so that a pad of the first die can be conducted to the conductive pillar.

In some examples, a second die is first disposed on the first surface of the substrate before the conductive pillars are formed on the first surface of the substrate. The conductive pillars are also formed on a surface that is of the second die and that is away from the substrate before the first insulated support layer is formed on the first surface, and the conductive pillars located on the surface of the second die are electrically connected to the second die.

Based on the foregoing method, the second die that is disposed first is used to occupy a part of space of the first surface of the substrate, so that when the conductive pillars are subsequently formed, some of the conductive pillars are formed on the first surface of the substrate, and the remaining conductive pillars can be directly formed on the surface of the second die, and are electrically connected to the second die.

In some examples, the disposing a first die on a surface that is of the first insulated support layer and that is away from the substrate includes:

disposing two first dies that are spaced apart from each other on the surface that is of the first insulated support layer and that is away from the substrate, where one of the first dies is connected to some of the conductive pillars, and the other first die is connected to the remaining conductive pillars, and each of the first dies is electrically connected to at least one conductive pillar located on the surface of the second die.

Based on the foregoing method, some of the conductive pillars are formed on the second die and are electrically connected to the second die. Therefore, the disposed first dies can be electrically connected to the second die by using the conductive pillars located on the surface of the second die.

In some other examples, three or more first dies that are spaced apart from each other are disposed on the surface that is of the first insulated support layer and that is away from the substrate. At least two first dies are not only electrically connected to the conductive pillars located on the surface of the substrate, but also electrically connected to the conductive pillars located on the surface of the second die. The remaining first die is electrically connected only to the conductive pillars located on the surface of the substrate.

Based on the foregoing method, a plurality of first dies are disposed in the first insulated support layer, and the conductive pillars on the surface of the second die and the second die are used, to form an electrical connection between some of the second dies.

In some examples, after the substrate is removed, the chip packaging method further includes:

connecting a surface that is of the first insulated support layer and that is away from the first die to a package substrate. After the substrate is removed, one end that is of the conductive pillar and that is away from the first die is exposed. The surface that is of the first insulated support layer and that is away from the first die is connected to the package substrate, to form an electrical connection between the conductive pillar and the package substrate, thereby forming an electrical connection between the first die and the package substrate.

In some examples, after the substrate is removed, the chip packaging method further includes:

disposing a second redistribution layer on a surface that is of the first insulated support layer and that is away from the first die, where a second metal layer in the second redistribution layer is electrically connected to the conductive pillar; and connecting the second redistribution layer to a package substrate.

Based on the foregoing method, after the substrate is removed to expose one end that is of the conductive pillar and that is away from the first die, the second redistribution layer is first disposed on the surface that is of the first insulated support layer and that is away from the first die, and the second metal layer in the second redistribution layer is used to enable the conductive pillar to form a connection to a part that needs to form an electrical connection and that is on the package substrate.

An embodiment of the application provides a packaged chip. The packaged chip is packaged by using embodiments of the chip packaging method as described herein.

DESCRIPTION OF EMBODIMENTS

Figure 1:
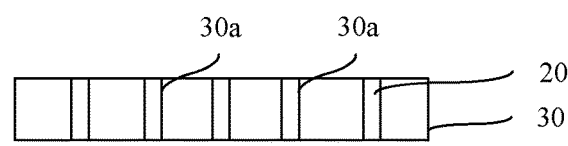
FIG. 1 is a schematic structural diagram of a vertical interconnection structure according to an embodiment of the application.

FIG. 1 is a schematic structural diagram of a vertical interconnection structure according to an embodiment of the application. As shown in FIG. 1, the vertical interconnection structure includes a first insulated support layer 30 and conductive pillars 20. There are a plurality of through holes 30a in the first insulated support layer 30. The conductive pillars 20 are located in the through holes 30a. The vertical interconnection structure is used for a connection in chip packaging. For example, a connection between chips and a connection between a chip and a package substrate are implemented by using the conductive pillars 20.

In a related technology, when the vertical interconnection structure is manufactured, the through holes 30a are first formed in the first insulated support layer 30, and then the conductive pillars 20 are formed in the through holes 30a through electroplating.

There are two relatively common methods for forming the through holes 30a. One is etching, and the other is laser ablation.

For etching, $SF_6$ plasma etching is usually used, and an etching process cannot well control a speed at which a material is corroded in different directions. Therefore, a shape of a through hole formed through etching is usually irregular, and to form a through hole with a relatively large depth, etching usually needs to be performed for a plurality of times. Each time etching is completed, a $C_4F_8$ passivation layer is formed on an inner wall of the through hole. Not only the process is complex, but also the efficiency is low, and the inner wall of the finally formed through hole is also uneven.

For laser ablation, the first insulated support layer 30 is irradiated by using high-energy pulsed laser to melt or even directly vaporize an irradiated part of the first insulated support layer 30, thereby forming through holes. In the laser ablation process, a local high temperature is formed in a region in which the first insulated support layer 30 is irradiated by the laser, and a heat-affected region is inevitably formed, which may affect reliability of a packaged chip. In addition, after the laser ablation is completed, spherical knobs are formed on an inner wall of the first insulated support layer 30 due to rapid solidification of the material, resulting in roughness of the hole wall.

The rough hole wall of the through hole 30a has adverse impact on the conductive pillar 20, causing pits and the like to appear on a surface of the conductive pillar 20. This ultimately affects quality of the vertical interconnection structure and adversely affects normal operation of the packaged chip.

Figure 2:
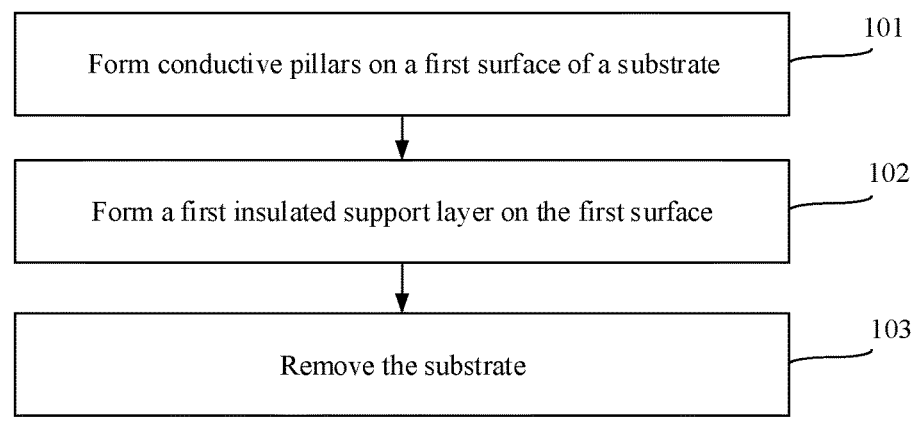
FIG. 2 is a flowchart of a method for manufacturing a vertical interconnection structure according to an embodiment of the application.
Figure 3:
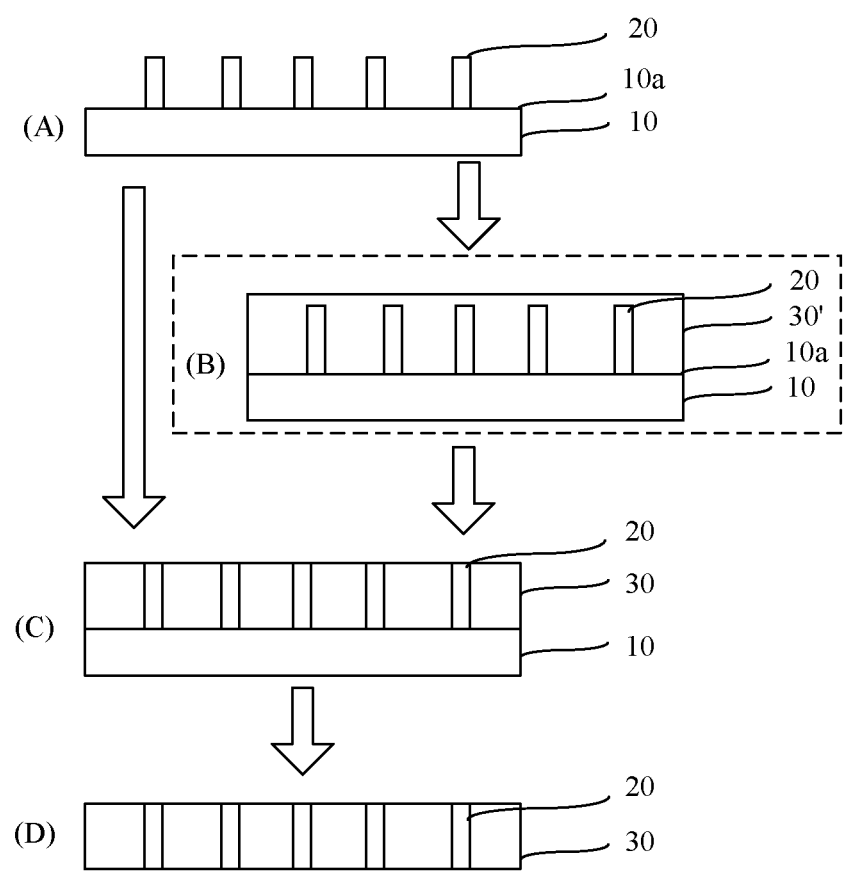
FIG. 3 is a schematic diagram of a process of manufacturing a vertical interconnection structure according to an embodiment of the application.

FIG. 2 is a flowchart of a method for manufacturing a vertical interconnection structure according to an embodiment of the application. FIG. 3 is a schematic diagram of a process of manufacturing a vertical interconnection structure according to an embodiment of the application. With reference to FIG. 2 and FIG. 3, the manufacturing method includes the following operations:

In operation 101, conductive pillars 20 are formed on a first surface 10a of a substrate 10.

As shown in A of FIG. 3, the conductive pillars 20 are formed on the first surface 10a of the substrate 10.

In operation 102, a first insulated support layer 30 is formed on the first surface 10a.

As shown in C of FIG. 3, the first insulated support layer 30 is formed on the first surface 10a.

The conductive pillars 20 are located in the first insulated support layer 30, and an upper surface that is of the conductive pillar 20 and that is away from the substrate 10 is not covered by the first insulated support layer. The first insulated support layer 30 includes at least one of the following materials: amorphous silicon, polycrystalline silicon, silicon carbide, silicon nitride, boron nitride, silicon dioxide, aluminum nitride, and diamond.

In operation 103, the substrate 10 is removed.

As shown in D of FIG. 3, the substrate 10 is removed, to obtain the manufactured vertical interconnection structure.

In an embodiment of the application, when the vertical interconnection structure is manufactured, the conductive pillars 20 are first formed on the first surface 10a of the substrate 10, and then the first insulated support layer 30 is directly formed on the first surface 10a of the substrate 10. Because the conductive pillars 20 are formed before the first insulated support layer 30, when the first insulated support layer 30 is formed, a material that forms the first insulated support layer 30 directly wraps outside the conductive pillars 20, so that the conductive pillars 20 are directly embedded in the first insulated support layer 30. Through holes do not need to be manufactured in the first insulated support layer in the entire manufacturing process, to avoid adverse impact caused by a process of manufacturing the through holes.

In an embodiment of the application, the first insulated support layer 30 is formed by at least one of the materials: amorphous silicon, polycrystalline silicon, silicon carbide, silicon nitride, boron nitride, silicon dioxide, aluminum nitride, and diamond. These materials can enable the formed first insulated support layer 30 to have a good heat dissipation capability and have a sufficient structural strength, to keep the vertical interconnection structure in a particular shape.

In some examples, a thickness of a material that is formed on the first surface 10a of the substrate 10 is controlled in operation 102, where the material herein is a material that forms the first insulated support layer 30, so that the upper surface that is of the conductive pillar 20 and that is away from the substrate 10 is exposed out of the first insulated support layer 30, and is not covered by the first insulated support layer 30.

For example, when the first insulated support layer 30 is formed through deposition, a deposition time is controlled when a deposition rate is fixed, to control a thickness of the deposited insulating supporting material. In this way, the upper surface that is of the conductive pillar 20 and that is away from the substrate 10 is exactly flush with a surface that is of the first insulated support layer 30 and that is away from the substrate 10 and is not covered by the first insulated support layer 30.

In some other examples, a second insulated support layer 30' with a relatively large thickness is first formed on the first surface 10a of the substrate 10, and then the second insulated support layer 30' is thinned, to manufacture the first insulated support layer 30 with a relatively small thickness.

As shown in B of FIG. 3, the second insulated support layer 30' is formed on the first surface 10a of the substrate 10, and the second insulated support layer 30' covers the conductive pillars 20. The second insulated support layer 30' is thinned, to make the upper surface that is of the conductive pillar 20 and that is away from the substrate 10 exposed, to obtain the first insulated support layer 30. Precise control of a thickness of deposition is not required, and the process is relatively simpler.

In an embodiment, the first insulated support layer 30 and the second insulated support layer 30' are both formed through deposition, for example, by using a plasma enhanced chemical vapor deposition method.

Figure 4:
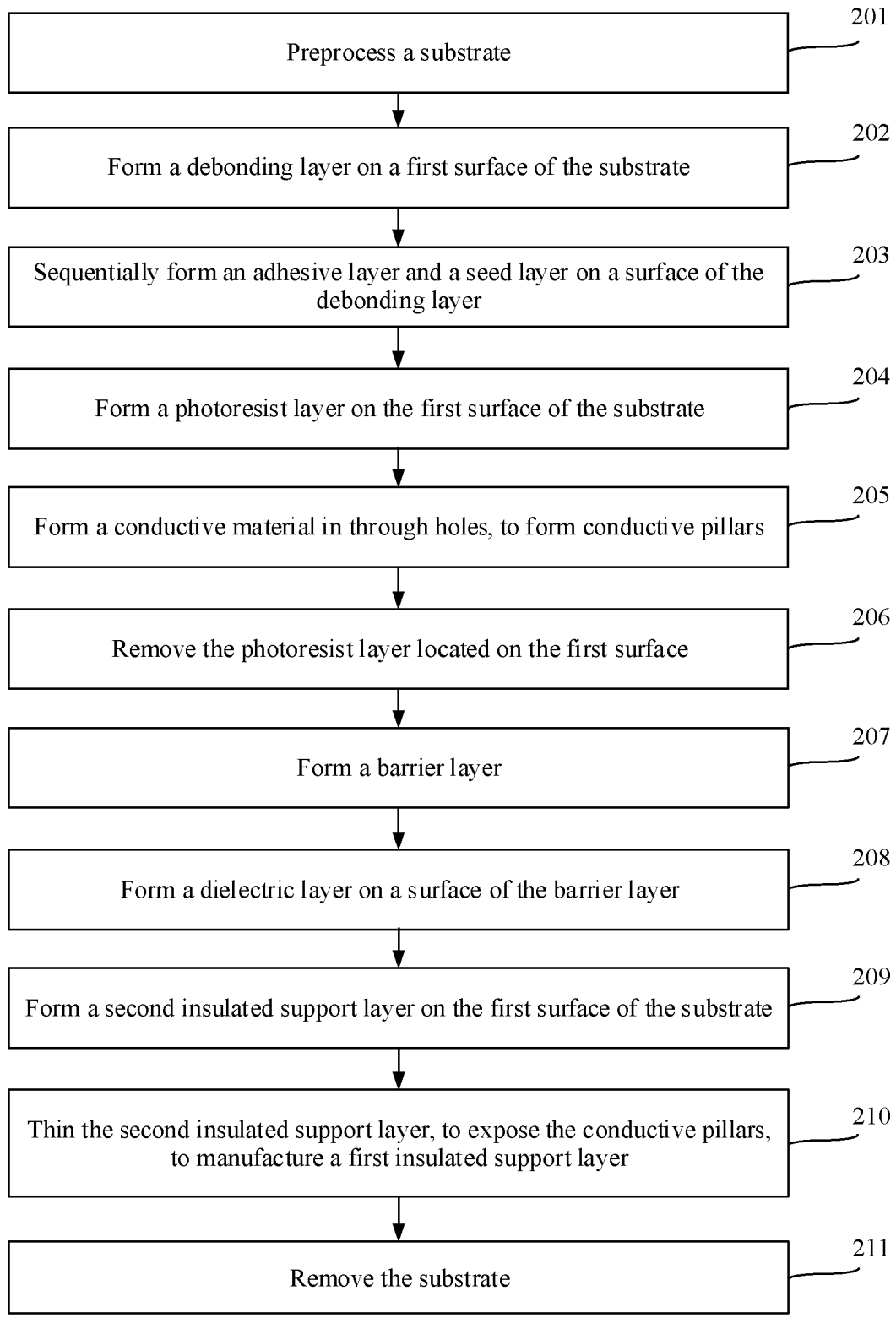
FIG. 4 is a flowchart of a method for manufacturing a vertical interconnection structure according to an embodiment of the application.
Figure 5:
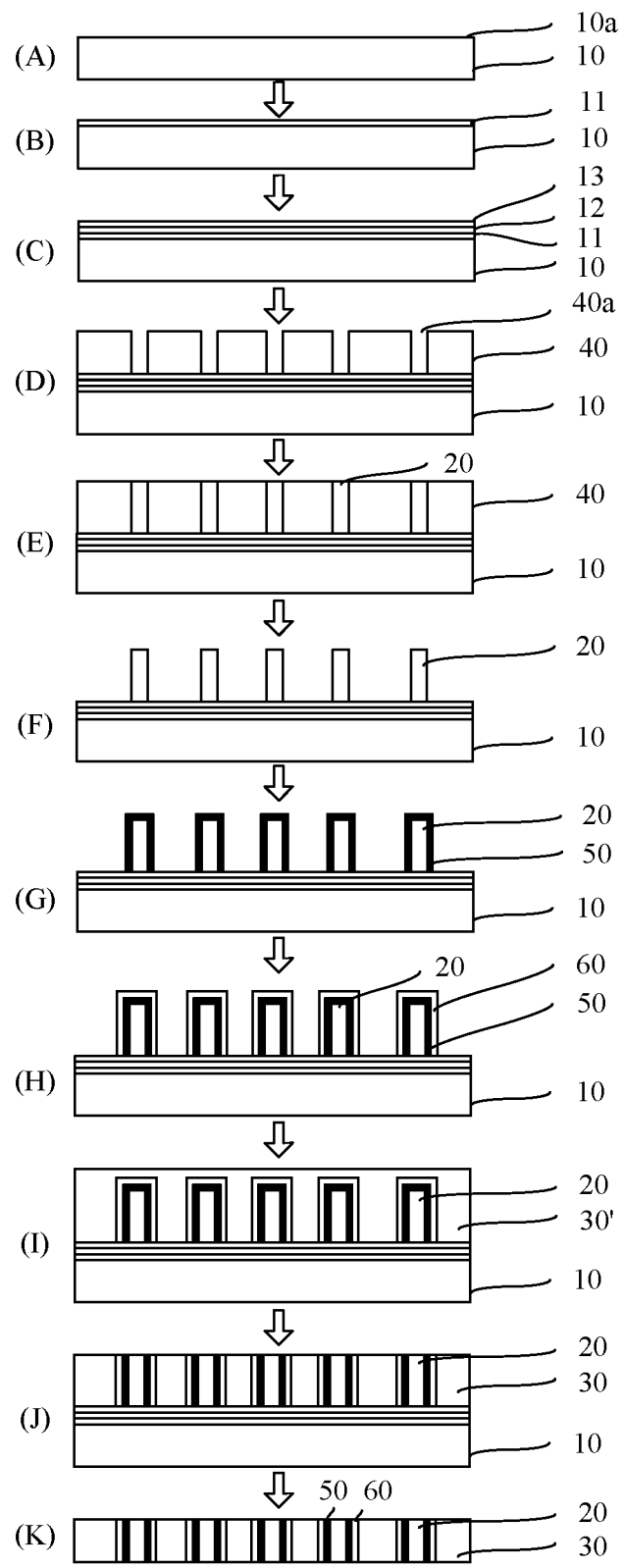
FIG. 5 is a schematic diagram of a process of manufacturing a vertical interconnection structure according to an embodiment of the application.

FIG. 4 is a flowchart of a method for manufacturing a vertical interconnection structure according to an embodiment of the application. FIG. 5 is a schematic diagram of a process of manufacturing a vertical interconnection structure according to an embodiment of the application. With reference to FIG. 4 and FIG. 5, the manufacturing method includes the following operations:

In operation 201, a substrate 10 is preprocessed, as shown in A of FIG. 5.

In some examples, the substrate 10 is a glass substrate or a silicon substrate.

In an embodiment, preprocessing includes cleaning the substrate 10. For example, the substrate 10 is ultrasonically cleaned by using a cleaning agent, and then the substrate 10 is blown dry by using nitrogen. The cleaning agent includes at least one of acetone, isopropanol, and deionized water. By cleaning and removing stains on a surface of the substrate 10, the stains are prevented from adversely affecting a subsequent manufacturing process.

In operation 202, a debonding layer 11 is formed on a first surface 10a of the substrate 10.

As shown in B of FIG. 5, the debonding layer 11 is formed on the first surface 10a of the substrate 10. The debonding layer 11 facilitates removal of the substrate 10 in a subsequent operation.

For example, the debonding layer 11 is a temporary bonding adhesive, and a thickness of the debonding layer 11 is 25 μm to 100 μm.

In operation 203, an adhesive layer 12 and a seed layer 13 are sequentially formed on a surface of the debonding layer 11.

As shown in C of FIG. 5, the adhesive layer 12 is located between the debonding layer 11 and the seed layer 13. The adhesive layer 12 can improve adhesion of the seed layer 13 and avoid separation of the seed layer 13 from the debonding layer 11, and the seed layer 13 can facilitate formation of a conductive pillar 20 in a subsequent operation through electroplating.

In some examples, the adhesive layer 12 is formed through physical vapor deposition (PVD), and the seed layer 13 is formed on a surface of the substrate 10 through chemical vapor deposition (CVD).

For example, the adhesive layer 12 is formed by titanium Ti, and a thickness of the adhesive layer 12 is 2 nm to 500 nm. The seed layer 13 is formed by copper Cu, and a thickness of the seed layer 13 is 30 nm to 500 nm.

In operation 204, a photoresist layer 40 is formed on the first surface 10a of the substrate 10.

As shown in D of FIG. 5, the photoresist layer 40 has through holes 40a.

For example, the photoresist layer 40 is formed on the first surface 10a of the substrate 10 by using a patterning process. A layer of photoresist is first coated on the first surface 10a of the substrate 10, and then exposure and development are performed to cure the photoresist, to form the photoresist layer 40 having the through holes 40a.

In operation 205, a conductive material is formed in the through hole 40a to form a conductive pillar 20, as shown in E of FIG. 5.

In some examples, the conductive material is a metallic material, for example, copper.

In an embodiment, the conductive pillar 20 is formed in the through hole 40a by using an electroplating process. In a process of electroplating, the foregoing seed layer 13 is used as an electrode, and the conductive material is constantly deposited on a surface of the seed layer 13 in the through hole 40a, to finally fill up the through hole 40a.

In operation 206, the photoresist layer 40 located on the first surface 10a is removed.

As shown in F of FIG. 5, after the photoresist layer 40 is removed, the conductive pillars 20 formed on the first surface 10a are exposed.

In an embodiment, after the conductive pillars 20 are formed, the adhesive layer 12 and the seed layer 13 are etched, to remove parts that are of the adhesive layer 12 and the seed layer 13 and that are between the conductive pillars 20. In this way, after the substrate 10 is subsequently removed, the adhesive layer 12 and the seed layer 13 do not need to be removed.

In operation 207, a barrier layer 50 is formed.

As shown in G of FIG. 5, the barrier layer 50 covers a surface of the conductive pillar 20. The surface of the conductive pillar 20 is covered by using the barrier layer 50, so that the conductive pillar 20 can be separated from a first insulated support layer 30 to be formed in a subsequent operation, to prevent diffusion between a metallic material that forms the conductive pillar 20 and an insulating supporting material that forms the first insulated support layer 30, thereby avoiding adverse impact.

In some examples, the barrier layer 50 is formed by using a chemical vapor deposition method or an atomic layer deposition (ALD) method. For example, the barrier layer 50 is deposited on the surface of the conductive pillar 20 by using a plasma enhanced chemical vapor deposition (PECVD) method.

In an embodiment, a thickness of the barrier layer 50 is 2 nm to 100 nm. An isolation effect of the barrier layer 50 is related to a material that forms the barrier layer 50 and the thickness of the barrier layer 50. For a same material, a larger thickness of the barrier layer 50 indicates a better isolation effect. When the material is given, the barrier layer 50 with a corresponding thickness is disposed based on an isolation effect to be achieved. In some examples, the thickness of the barrier layer 50 is 2 nm to 20 nm. For a material having a relatively good isolation effect, the relatively thin barrier layer 50 can already produce a sufficient isolation effect. In an embodiment of the application, the thickness of the barrier layer 50 is 5 nm.

In an embodiment, the material that forms the barrier layer 50 is at least one of Ti, W, Ta, TiN, Pt, TaN, TiW, and $Si_3N_4$.

For example, after the material that forms the barrier layer 50 is deposited, the deposited material is etched, and a material covering the surface of the conductive pillar 20 is kept.

In operation 208, a dielectric layer 60 is formed on a surface of the barrier layer 50.

As shown in H of FIG. 5, the dielectric layer 60 covers the surface of the barrier layer 50. The dielectric layer 60 can implement a function of insulation, to insulate the conductive pillar 20 from the first insulated support layer 30 to be formed in a subsequent operation, thereby preventing deficiencies such as current leakage in the vertical interconnection structure.

In some examples, the dielectric layer 60 is formed by using a method the same as that for forming the barrier layer 50, for example, by using the chemical vapor deposition method or the atomic layer deposition method.

In an embodiment, a thickness of the dielectric layer 60 is 3 nm to 200 nm. An insulating capability of the dielectric layer 60 is related to a material that forms the dielectric layer 60 and the thickness of the dielectric layer 60. For a same material, a larger thickness of the dielectric layer 60 indicates a stronger insulating capability of the dielectric layer 60. When the material is given, the dielectric layer 60 with a corresponding thickness is disposed based on an insulating capability to be achieved. For a material having relatively good insulativity, the relatively thin dielectric layer 60 can already produce a sufficient insulating capability. In an embodiment of the application, the thickness of the dielectric layer 60 is 10 nm.

In an embodiment, the insulating material that forms the dielectric layer 60 is at least one of $SiO_2$, $Al_2O_3$, $HfO_2$, $Si_3N_4$, $Al_2O_3$, and AlN.

For example, after the material that forms the dielectric layer 60 is deposited, the deposited material is etched, and a material covering the conductive pillar 20 is kept. In addition, in some other embodiments, the barrier layer 50 and the dielectric layer 60 are etched together, and the material covering the conductive pillar 20 is kept, to reduce one etching process.

In some examples, if the material that forms the barrier layer 50 is $Si_3N_4$ in operation 204, the dielectric layer 60 may be omitted. Correspondingly, operation 205 is omitted in the method for manufacturing the vertical interconnection structure. This is because the barrier layer 50 formed by using $Si_3N_4$ as the material has both functions of preventing diffusion and preventing current leakage. Certainly, even if the barrier layer 50 is formed by using $Si_3N_4$ as the material, when a dielectric layer 60 is disposed, the insulation effect can be further enhanced and current leakage can be prevented.

In operation 209, a second insulated support layer is formed on the first surface of the substrate.

As shown in I of FIG. 5, the second insulated support layer 30' is formed on the first surface 10a of the substrate 10.

In an embodiment of the application, the second insulated support layer 30' is formed through deposition. For example, the second insulated support layer 30' is formed by using a plasma enhanced chemical vapor deposition method.

A material that forms the second insulated support layer 30' is at least one of amorphous silicon, polycrystalline silicon, silicon carbide, silicon nitride, boron nitride, silicon dioxide, aluminum nitride, and diamond. For example, polycrystalline silicon is used as a material for deposition. An insulating supporting material, namely, the polycrystalline silicon material, is deposited on the first surface 10a of the substrate 10, and the second insulated support layer 30' is formed by depositing the insulating supporting material with a particular thickness.

For example, when the insulating supporting material is deposited, a radio frequency is 13.5 MHz to 90 MHz, a radio frequency power is 20 W to 1000 W, and a reaction temperature is 140° C. to 400° C.

In an embodiment of the application, single crystal silicon is used as a target with a purity of 99.99%, and a sputtering gas is Ar with a purity of 99.99%.

In an embodiment, when the second insulated support layer 30' is formed, a raw gas is at least one of $SiH_4$, $SiH_2Cl_2$, $SiHCl_3$, and $SiF_4$. The raw gas is mixed with a catalytic gas $H_2$ and a diluent gas Ar.

In operation 210, the second insulated support layer 30' is thinned to expose the conductive pillars 20, to manufacture the first insulated support layer 30.

As shown in J of FIG. 5, the second insulated support layer 30' is thinned to obtain the first insulated support layer 30, and an upper surface that is of the conductive pillar 20 and that is away from the substrate 10 is exposed from the first insulated support layer 30.

In an embodiment of the application, the second insulated support layer 30' is polished from an upper surface that is of the second insulated support layer 30' and that is away from the substrate 10, to reduce a thickness of the second insulated support layer 30', so that the upper surface that is of the conductive pillar 20 and that is away from the substrate 10 is exposed.

In an embodiment, a thickness of a material that is formed on the first surface 10a of the substrate 10 is controlled, where the material herein is a material that forms the first insulated support layer 30, so that the upper surface that is of the conductive pillar 20 and that is away from the substrate 10 is not covered, thereby directly manufacturing the first insulated support layer 30 without thinning. Materials are saved from the perspective of material consumption.

In an embodiment, the thickness of the first insulated support layer 30 is the same as a height of the conductive pillar 20. That is, two end surfaces of the conductive pillar 20 are exactly flush with two surfaces of the first insulated support layer 30, to facilitate an electrical connection between the conductive pillar 20 and structures such as a chip, a package substrate, and a redistribution layer.

In operation 211, the substrate is removed.

As shown in K of FIG. 5, after the substrate 10 is removed, a manufactured vertical interconnection structure is obtained.

In an embodiment of the application, before operation 201, the debonding layer 11 has been formed on the first surface 10a of the substrate 10, and the substrate 10 is separated from the first insulated support layer 30 by making the debonding layer 11 lose viscosity. For example, the debonding layer 11 is a temporary bonding adhesive, and the substrate 10 is separated by debonding the temporary bonding adhesive. Alternatively, the substrate 10 is thinned for removal of the substrate.

Figure 6:
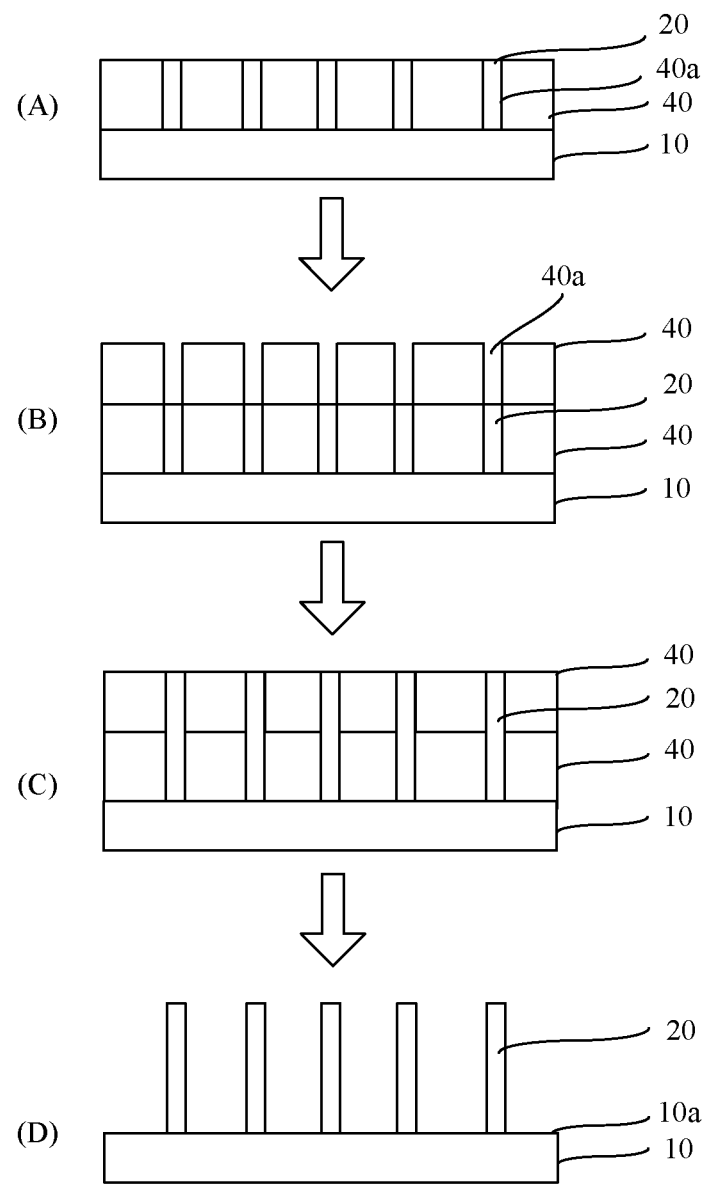
FIG. 6 is a schematic diagram of a process of lengthening a conductive pillar according to an embodiment of the application.

In some other examples, the formed conductive pillars 20 are further lengthened before operation 206. The conductive pillars 20 are lengthened, so that a length of the conductive pillar 20 is larger, thereby meeting a design requirement. FIG. 6 is a schematic diagram of a process of lengthening a conductive pillar according to an embodiment of the application. In FIG. 6, at least the debonding layer 11, the adhesive layer 12, the seed layer 13, the barrier layer 50, and the dielectric layer 60 are omitted. As shown in FIG. 6, in an embodiment of the application, the conductive pillar 20 is lengthened in the following manner:

Operation 1: Form a photoresist layer 40 again on a surface that is of the formed photoresist layer 40 and that is away from the substrate 10, where through holes 40a of the newly formed photoresist layer 40 are in communication with the through holes 40a of the formed photoresist layer 40.

Operation 2: Form a conductive material in the through holes 40a of the newly formed photoresist layer 40, to lengthen the conductive pillars 20.

As shown in A of FIG. 6, after operation 205 is performed, the photoresist layer 40 with a particular thickness and the conductive pillars 20 with a particular height are formed on the first surface 10a of the substrate 10. After operation 205, as shown in B of FIG. 6, a thickness of the formed total photoresist layer is increased by performing operation 1. As shown in C of FIG. 6, in operation 2, the conductive material is formed again. Because the through holes 40a of the photoresist layer 40 formed in operation 1 are in communication with the through holes 40a formed previously, the conductive material formed again is stacked on the formed conductive pillar 20, and the conductive material formed in operation 2 also becomes a part of the conductive pillar 20, thereby increasing the length of the conductive pillar 20. For example, FIG. 6 shows only a case in which operation 1 and operation 2 are performed once. As shown in D of FIG. 6, after the conductive pillar 20 is lengthened, the conductive pillar 20 is exposed after all the photoresist layers 40 are removed.

In an embodiment of the application, by repeatedly performing operation 1 and operation 2 for a plurality of times, the length of the conductive pillar 20 can be further increased, to form the conductive pillar 20 with a relatively large length-to-diameter ratio. For example, before operation 203, operation 1 and operation 2 are performed once to increase the length of the conductive pillar 20, and operation 1 and operation 2 are performed once again to increase the length of the conductive pillar 20 again.

In an embodiment, the length-to-diameter ratio of the conductive pillar 20 is greater than 0 and is less than or equal to 20. By repeatedly performing operation 1 and operation 2 for a plurality of times, the length-to-diameter ratio of the conductive pillar 20 can be enlarged.

In the vertical interconnection structure manufactured by using a process method in the related technology, due to limitation of precision of the process of forming the through holes in the insulated support layer, the length-to-diameter ratio of the conductive pillar is usually relatively small. A larger length-to-diameter ratio indicates more serious deficiencies of the manufactured conductive pillar. Consequently, the length-to-diameter ratio of the conductive pillar is usually not greater than 8. In an embodiment of the application, operation 1 and operation 2 are repeatedly performed for a plurality of times, to lengthen the conductive pillar 20 for a plurality of times, so that the length-to-diameter ratio of the conductive pillar 20 can reach a relatively large range. For example, the length-to-diameter ratio of the conductive pillar 20 is 15:1 to 12:1.

In some examples, thicknesses of the photoresist layers 40 formed in operation 201 and operation 1 are both 30 μm to 50 μm. In each process of forming the photoresist layer 40, a larger thickness of the photoresist layer 40 indicates longer through holes 40a to be formed, and lower precision of the through holes 40a. The thickness of the photoresist layer 40 formed each time is limited to 30 μm to 50 μm, so that the length of the through hole 40a formed each time is also only 30 μm to 50 μm, to avoid low precision of the through hole 40a, so that formation of the conductive pillar 20 is not affected.

In an embodiment, a minimum distance between the conductive pillars 20 is 5 μm to 100 μm. That is, a distance between conductive pillars 20 that are closest to each other is 5 μm to 100 μm. For example, in an embodiment of the application, the minimum distance between the conductive pillars 20 is 10 μm to 20 μm.

In the related technology, due to limitation of precision of the process of forming the through holes in the insulated support layer, a distance between adjacent through holes is relatively large, usually greater than or equal to 120 μm. This leads to a relatively large distance between conductive pillars in the formed vertical interconnection structure. Consequently, distribution density of the conductive pillars is relatively low. In an embodiment of the application, the through holes 40a are in the photoresist layer 40, and the precision of the process of forming the through holes 40a in the photoresist layer 40 is much higher than that of the process of forming the through holes in the insulated support layer. Therefore, the through holes 40a that are distributed relatively densely can be formed in the photoresist layer 40. The distribution density of the conductive pillars 20 is higher in the vertical interconnection structure manufactured in this way, and the minimum distance between the conductive pillars 20 can be set smaller.

An embodiment of the application further provides a vertical interconnection structure. The vertical interconnection structure is manufactured by using the manufacturing method shown in FIG. 2 or FIG. 4.

Figure 7:
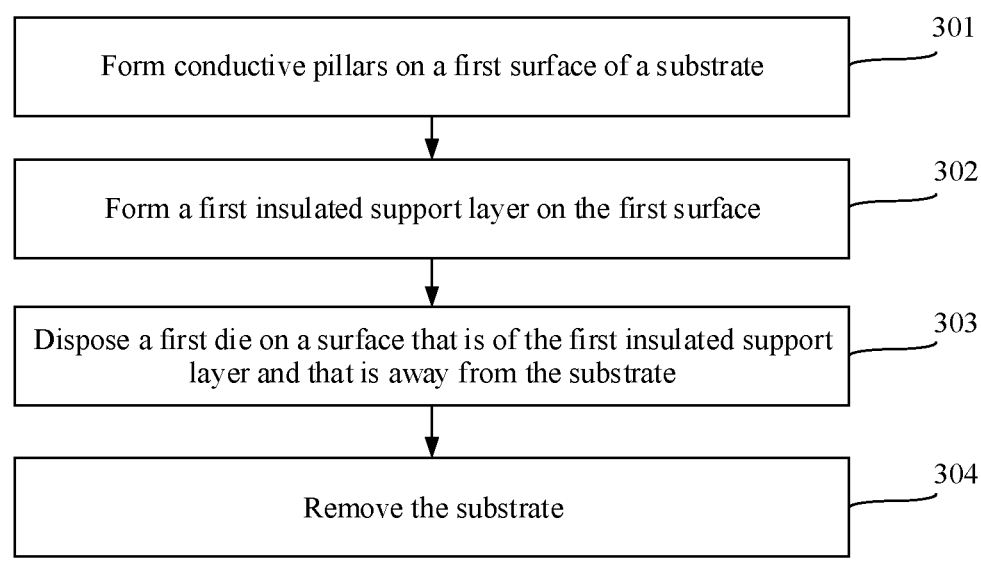
FIG. 7 is a flowchart of a chip packaging method according to an embodiment of the application.
Figure 8:
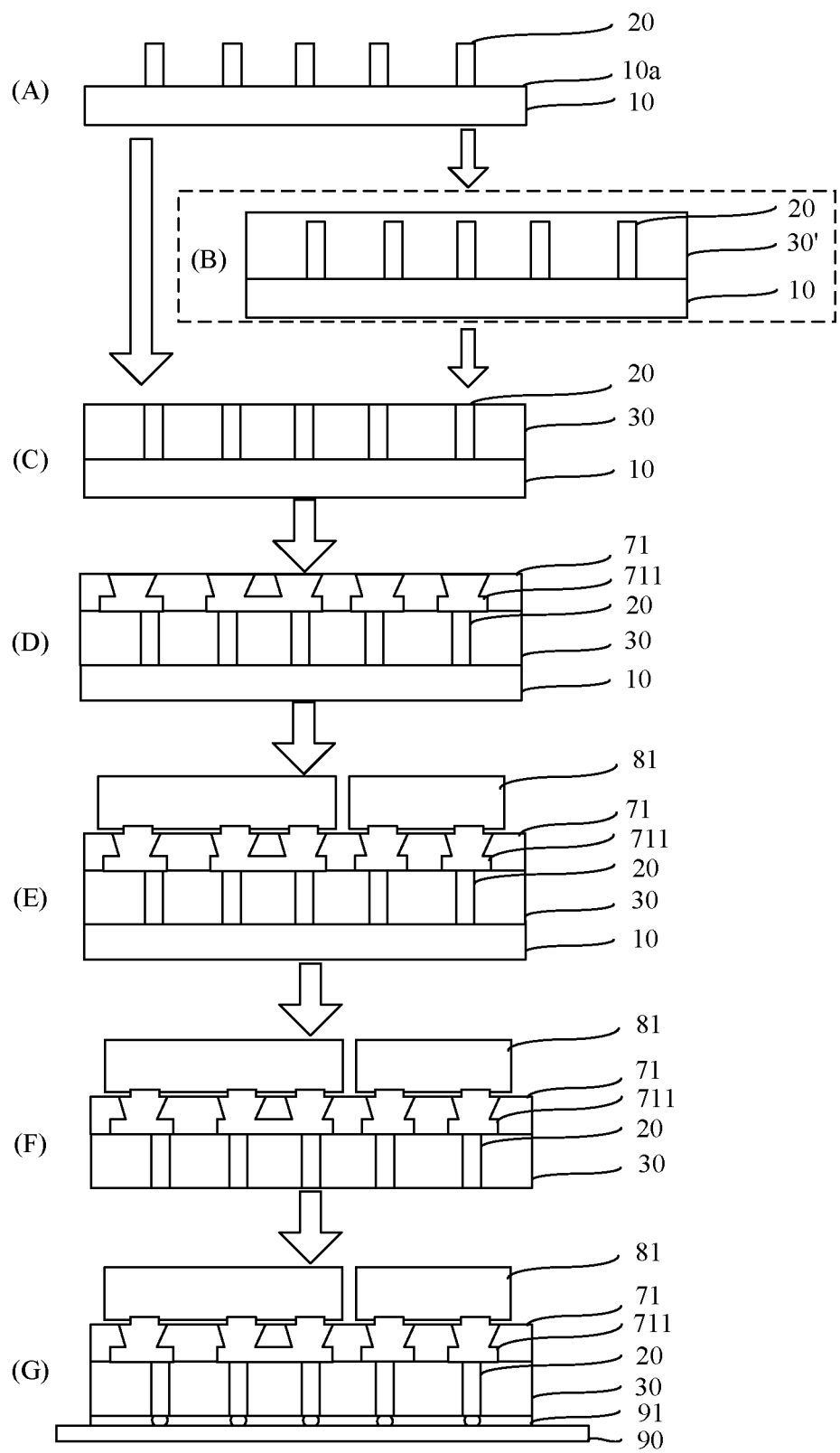
FIG. 8 is a schematic diagram of a chip packaging process according to an embodiment of the application.

An embodiment of the application further provides a chip packaging method. FIG. 7 is a flowchart of a chip packaging method according to an embodiment of the application. FIG. 8 is a schematic diagram of a chip packaging process according to an embodiment of the application. With reference to FIG. 7 and FIG. 8, the method includes the following operations:

In operation 301, conductive pillars 20 are formed on a first surface 10a of a substrate 10.

As shown in A of FIG. 8, the conductive pillars 20 are formed on the first surface 10a of the substrate 10.

In operation 302, a first insulated support layer 30 is formed on the first surface 10a.

As shown in C of FIG. 8, the conductive pillars 20 are located in the first insulated support layer 30, and an upper surface that is of the conductive pillar 20 and that is away from the substrate 10 is not covered by the first insulated support layer 30.

In an embodiment of the application, the first insulated support layer 30 includes at least one of the following materials: amorphous silicon, polycrystalline silicon, silicon carbide, silicon nitride, boron nitride, silicon dioxide, aluminum nitride, and diamond.

In some examples, a second insulated support layer 30' is first formed on the first surface 10a, and then the second insulated support layer 30' is thinned, to expose the conductive pillars 20, to manufacture the first insulated support layer 30.

As shown in B and C of FIG. 8, the formed second insulated support layer 30' covers the upper surface that is of the conductive pillar 20 and that is away from the substrate 10. After the second insulated support layer 30' is thinned, the upper surface that is of the conductive pillar 20 and that is away from the substrate 10 is exposed.

In an embodiment of the application, for formation of the conductive pillars 20 and formation of the first insulated support layer 30, refer to the operations before the substrate is removed in the method for manufacturing the vertical interconnection structure shown in FIG. 2, or refer to the operations before the substrate is removed in the method for manufacturing the vertical interconnection structure shown in FIG. 4. Details are not described herein again.

In operation 303, a first die 81 is disposed on a surface that is of the first insulated support layer 30 and that is away from the substrate 10.

In operation 304, the substrate 10 is removed.

As shown in F of FIG. 8, after the substrate 10 is removed, an end portion of the conductive pillar 20 is exposed.

In an embodiment, after the substrate 10 is removed, chemical mechanical polishing (CMP) is performed on a surface that is of the first insulated support layer 30 and that is away from the first die 81, so that the surface of the first insulated support layer 30 is flat and smooth, and it is ensured that the conductive pillars 20 can be exposed.

In an embodiment of the application, the conductive pillars 20 are first formed on the first surface 10a of the substrate 10, and then the first insulated support layer 30 is directly formed on the first surface 10a of the substrate 10. Because the conductive pillars 20 are formed before the first insulated support layer 30, when the first insulated support layer 30 is formed, a material that forms the first insulated support layer 30 directly wraps outside the conductive pillars 20, so that the conductive pillars 20 are directly embedded in the first insulated support layer 30. Through holes 40a do not need to be manufactured in the first insulated support layer 30 in the entire manufacturing process, to avoid adverse impact caused by a process of manufacturing the through holes 40a.

In an embodiment, as shown in D and E of FIG. 8, in operation 303, disposing the first die 81 on the surface that is of the first insulated support layer 30 and that is away from the substrate 10 includes:

forming a first redistribution layer 71 on the surface that is of the first insulated support layer 30 and that is away from the substrate 10; and disposing the first die 81 on a surface that is of the first redistribution layer 71 and that is away from the first insulated support layer 30. A first metal layer 711 in the first redistribution layer 71 is electrically connected to the conductive pillar 20, and the first die 81 is electrically connected to the first metal layer 711.

As shown in D of FIG. 8, the first redistribution layer 71 is first formed, to provide basis for disposing the first die 81. As shown in E of FIG. 8, the first metal layer 711 in the first redistribution layer 71 is used for connecting the first die 81 to the conductive pillar 20, so that a pad of the first die 81 can be conducted to the conductive pillar 20.

In an embodiment, two or more first dies 81 are disposed on the surface that is of the first redistribution layer 71 and that is away from the first insulated support layer 30. A quantity of the first dies 81 disposed in the first redistribution layer 71 is set based on a chip packaging structure.

Figure 9:
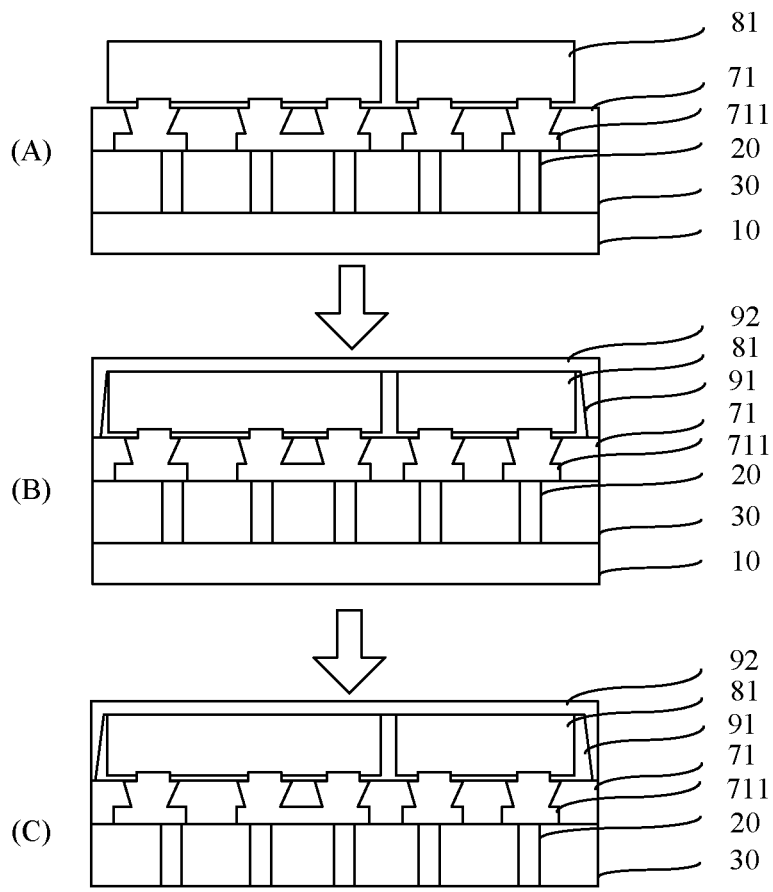
FIG. 9 is a schematic diagram of a chip packaging process according to an embodiment of the application.

FIG. 9 is a schematic diagram of a chip packaging process according to an embodiment of the application. In some examples, as shown in A and B of FIG. 9, after first dies 81 are disposed on a surface that is of a first redistribution layer 71 and that is away from a first insulated support layer 30, an underfill 91 is formed between the first dies 81 and the first redistribution layer 71. The underfill 91 at least can enhance heat exchange between the first dies 81 and the first redistribution layer 71, and can also reduce a possibility that a connection between the first dies 81 and the first redistribution layer 71 is broken when a chip packaging structure is impacted by an external force, for example, falls down.

As shown in B of FIG. 9, after the underfill 91 is formed, plastic packaging is further performed on the first dies 81.

For example, a polymer molding material 92 is covered on the first redistribution layer 71, and the first dies 81 are wrapped by using the polymer molding material 92. For example, the polymer molding material 92 includes resin. The first dies 81 are wrapped by using the polymer molding material 92, so that the first dies 81 can be protected.

Referring to FIG. 8, in some examples, after the substrate 10 is removed in operation 304, the surface that is of the first insulated support layer 30 and that is away from the first die 81 is connected to a package substrate 90.

As shown in C of FIG. 9, after the substrate 10 is removed, one end that is of a conductive pillar 20 and that is away from the first die 81 is exposed. The first die 81 is connected to the package substrate 90 by using the conductive pillars 20. For example, the conductive pillars 20 are soldered with the package substrate 90 by using solderballs.

Figure 10:
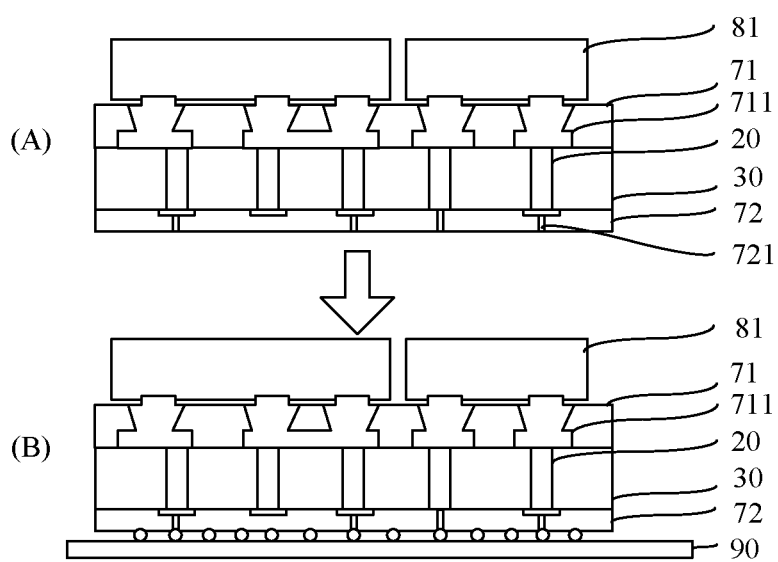
FIG. 10 is a schematic diagram of a chip packaging process according to an embodiment of the application.

FIG. 10 is a schematic diagram of a chip packaging process according to an embodiment of the application. As shown in FIG. 10, in some examples, as shown in A of FIG. 10, after the substrate 10 is removed in operation 304, a second redistribution layer 72 is disposed on the surface that is of the first insulated support layer 30 and that is away from the first die 81. As shown in B of FIG. 10, the second redistribution layer 72 is connected to a package substrate 90. A second metal layer 721 in the second redistribution layer 72 is electrically connected to a conductive pillar 20.

After the substrate 10 is removed, the first insulated support layer 30 is not directly connected to the package substrate 90. Instead, the second redistribution layer 72 is first manufactured, and then the first insulated support layer 30 is connected to the package substrate 90 by using the second redistribution layer 72. The second metal layer 721 in the second redistribution layer 72 enables the conductive pillar 20 to be connected to a pad on the package substrate 90.

Figure 11:
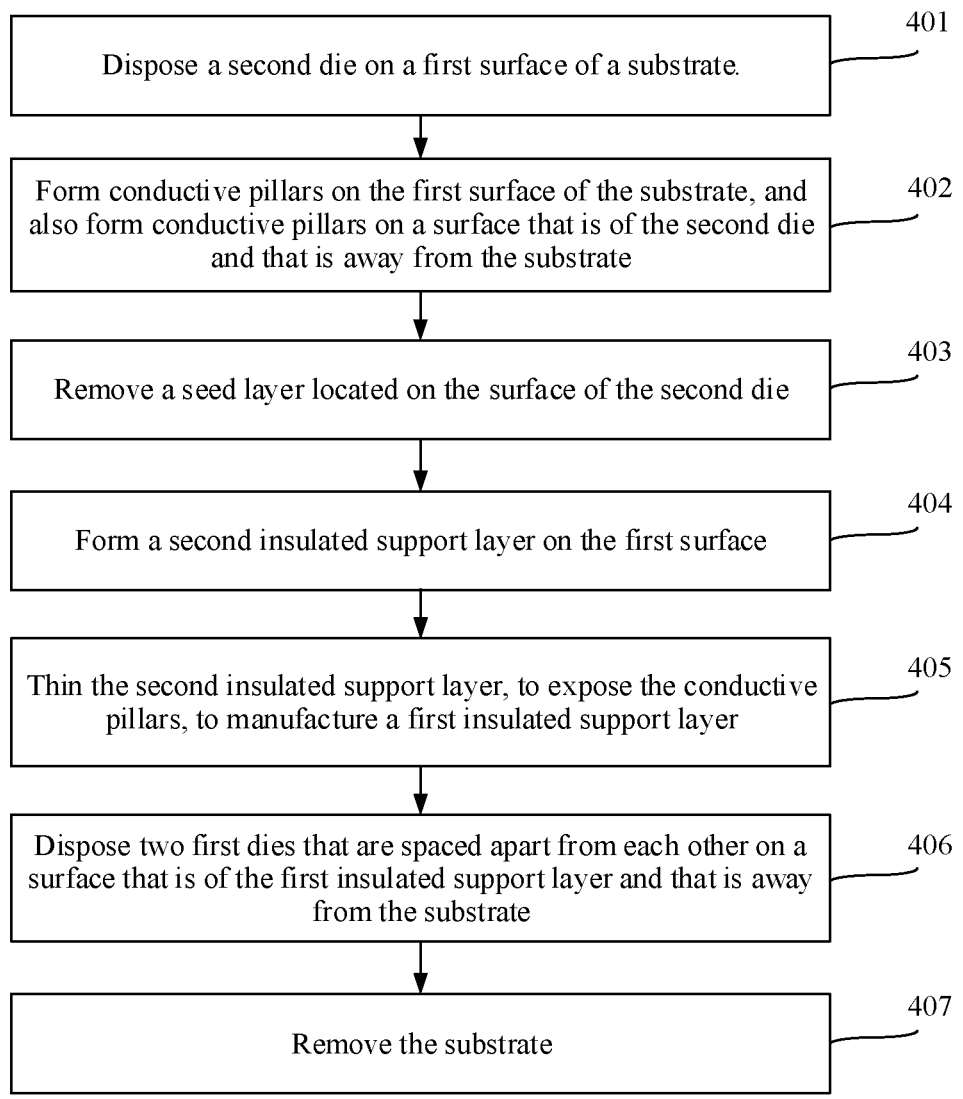
FIG. 11 is a flowchart of a chip packaging method according to an embodiment of the application.
Figure 12:
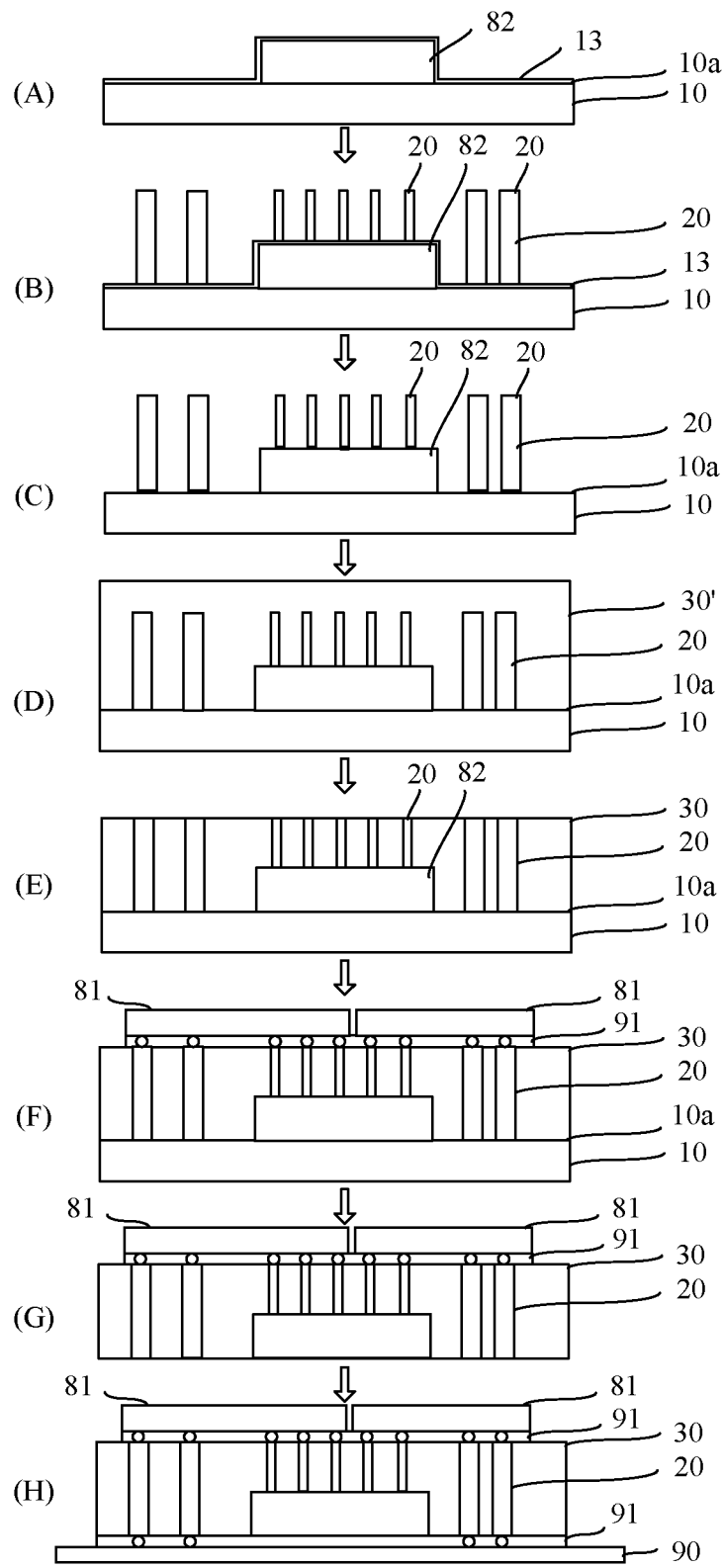
FIG. 12 is a schematic diagram of a chip packaging process according to an embodiment of the application.

FIG. 11 is a flowchart of a chip packaging method according to an embodiment of the application. FIG. 12 is a schematic diagram of a chip packaging process according to an embodiment of the application. With reference to FIG. 11 and FIG. 12, the method includes the following operations:

In operation 401, a second die 82 is disposed on a first surface 10a of a substrate 10.

In some examples, the second die 82 is a silicon bridge chip. There are pads on a surface that is of the second die 82 and that is away from the substrate 10. The pads are used for electrical connection of the second die 82.

The second die 82 is first disposed on the first surface 10a of the substrate 10 to occupy a space, so that a photoresist layer to be formed in a subsequent operation can cover the substrate 10 and the second die 82, and when conductive pillars 20 are formed, some of the conductive pillars 20 can be formed on a surface of the second die 82.

In an embodiment, a temporary bonding adhesive is disposed on the first surface 10a of the substrate 10, to help adhere the second die 82 to the substrate 10, and also help separate the substrate 10 in a subsequent operation.

In operation 402, conductive pillars 20 are formed on the first surface 10a of the substrate 10, and conductive pillars 20 are also formed on a surface that is of the second die 82 and that is away from the substrate 10.

The conductive pillars 20 located on the surface of the second die 82 are electrically connected to the second die 82.

As shown in A of FIG. 12, at least a seed layer 13 is formed on surfaces of the substrate 10 and the second die 82 before the conductive pillars 20 are formed.

Before the conductive pillars 20 are formed, the second die 82 is first disposed on the surface of the substrate 10, and occupies a part of space. Therefore, some of the conductive pillars 20 can be formed on the second die 82.

For a method for forming the conductive pillars 20 in operation 402, refer to operations 202 to 206 in the foregoing method.

In an embodiment of the application, in a process of forming the conductive pillars 20, on the surface that is of the second die 82 and that is away from the substrate 10, orthographic projections of some of through holes of the photoresist layer at least partially overlap the pads on the surface of the second die 82, so that the conductive pillars 20 formed on the surface of the second die 82 can be electrically connected to the pads on the surface of the second die 82.

In operation 403, the seed layer 13 located on the surface of the second die 82 is removed.

As described in the foregoing operation 203, before the photoresist layer 40 is formed, the seed layer 13 is first formed on the surface of the substrate 10, to help form the conductive pillars 20 through electroplating. In a subsequent operation, after the substrate 10 is removed, the seed layer 13 may be removed. However, a part that is of the seed layer 13 and that covers the surface of the second die 82 cannot be removed after the substrate 10 is removed. In addition, as shown in B of FIG. 12, the part that is of the seed layer 13 and that covers the surface of the second die 82 further connects all the conductive pillars 20 located on the surface of the second die 82 to form an entirety, and the part that is of the seed layer 13 and that covers the surface of the second die 82 is first processed in operation 403.

In some examples, as shown in C of FIG. 12, the seed layer 13 is etched, to remove parts of the seed layer 13 that are located between the conductive pillars 20, thereby avoiding short circuit between the conductive pillars 20 caused by the seed layer 13.

In an embodiment of the application, when the seed layer 13 is etched, at least the part that is of the seed layer 13 and that is located on the surface of the second die 82 is etched. Even if a part that is of the seed layer 13 and that is located on the first surface 10a of the substrate 10 is not etched in operation 403, the part may be removed after the substrate 10 is subsequently removed.

In an embodiment, after the seed layer located on the surface of the second die 82 is removed, a barrier layer 50 is formed on a surface of the conductive pillar 20, or the barrier layer 50 and a dielectric layer 60 are sequentially formed. For a manner of forming the barrier layer 50, refer to the foregoing operation 207. For a manner of forming the dielectric layer 60, refer to the foregoing operation 208.

In operation 404, a second insulated support layer 30' is formed on the first surface 10a as shown in D of FIG. 12.

In an embodiment of the application, for a manner of forming the second insulated support layer 30' in operation 404, refer to the foregoing operation 209.

In operation 405, the second insulated support layer 30' is thinned to expose the conductive pillars 20, to manufacture the first insulated support layer 30 as shown in E of FIG. 12.

In an embodiment of the application, for a manner of thinning the second insulated support layer 30' in operation 405, refer to the foregoing operation 210.

In some examples, a thickness of a material that is formed on the first surface 10a of the substrate 10 can also be controlled, where the material herein is a material that forms the first insulated support layer 30, so that an upper surface that is of the conductive pillar 20 and that is away from the substrate 10 is not covered, thereby directly manufacturing the first insulated support layer 30 without thinning. Materials are saved from the perspective of material consumption.

In an embodiment, the thickness of the first insulated support layer 30 is the same as a height of the conductive pillar 20. That is, two end surfaces of the conductive pillar 20 are exactly flush with two surfaces of the first insulated support layer 30, to facilitate an electrical connection between the conductive pillar 20 and structures such as a chip, a package substrate, and a redistribution layer.

In operation 406, two first dies 81 that are spaced apart from each other are disposed on a surface that is of the first insulated support layer 30 and that is away from the substrate 10.

As shown in F of FIG. 12, one of the first dies 81 is connected to some of the conductive pillars 20, and the other first die 81 is connected to the remaining conductive pillars 20, and each of the first dies 81 is electrically connected to at least one conductive pillar 20 located on the surface of the second die 82.

In the foregoing operation 402, the conductive pillars 20 electrically connected to the pads of the second die 82 are formed on the surface that is of the second die 82 and that is away from the substrate 10. Therefore, the disposed first dies 81 can be electrically connected to the second die 82 by using the conductive pillars 20 located on the surface of the second die 82.

A quantity of the first dies 81 is set based on a chip packaging structure. For example, in some other examples, three or more first dies 81 that are spaced apart from each other are disposed on the surface that is of the first insulated support layer 30 and that is away from the substrate 10. At least two first dies 81 are not only electrically connected to the conductive pillars 20 located on the surface of the substrate 10, but also electrically connected to the conductive pillars 20 located on the surface of the second die 82.

As shown in F of FIG. 12, after the first dies 81 are disposed in the first insulated support layer 30, an underfill 91 is formed between the first dies 81 and the first insulated support layer 30, to reduce a possibility that a connection between the first dies 81 and the first insulated support layer 30 is broken.

In operation 407, the substrate 10 is removed as shown in G of FIG. 12.

In some examples, as shown in H of FIG. 12, after the substrate 10 is removed in operation 407, a surface that is of the first insulated support layer 30 and that is away from the first die 81 is connected to a package substrate 90.

In an embodiment, the substrate 10 is thinned for removal of the substrate 10.

Alternatively, the temporary bonding adhesive is debonded to remove the substrate 10.

In an embodiment, after the substrate 10 is removed, chemical mechanical polishing is performed on the surface that is of the first insulated support layer 30 and that is away from the first die 81, so that the surface that is of the first insulated support layer 30 and that is away from the first die 81 is flat and smooth, and it is ensured that the conductive pillars 20 can be exposed.

After the substrate 10 is removed, one end that is of the conductive pillar 20 and that is away from the first die 81 is exposed. The first die 81 is connected to the package substrate 90 by using the conductive pillars 20. For example, the conductive pillars 20 are soldered with the package substrate 90 by using solderballs.

In some examples, after the substrate 10 is removed in operation 407, a second redistribution layer 72 is further disposed. For example, referring to FIG. 10, the second redistribution layer 72 is disposed on the surface that is of the first insulated support layer 30 and that is away from the first die 81, to connect the first insulated support layer 30 to the package substrate 90. A second metal layer 721 in the second redistribution layer 72 is electrically connected to the conductive pillar 20.

After the substrate 10 is removed, the first insulated support layer 30 is not directly connected to the package substrate 90. Instead, the second redistribution layer 72 is first manufactured, and then the first insulated support layer 30 is connected to the package substrate 90 by using the second redistribution layer 72. The second metal layer 721 in the second redistribution layer 72 enables the conductive pillar 20 to be connected to a pad on the package substrate 90.

An embodiment of the application further provides a packaged chip. The packaged chip is packaged by using any chip packaging method shown in FIG. 7 or FIG. 11.

Unless otherwise defined, a technical term or a scientific term used herein should have a general meaning understood by one of ordinary skill in the art of the application. In the specification and claims of the application, the terms "first", "second", "third", and the like are not intended to indicate any order, quantity or significance, but are intended to distinguish between different components. Likewise, "a/an", "one", or the like is not intended to indicate a quantity limitation either, but is intended to indicate existing at least one. Similar words such as "include" or "comprise" mean that elements or articles preceding "include" or "comprise" cover elements or articles enumerated after "include" or "comprise" and their equivalents, and do not exclude other elements or articles. "Connection", "link" or the like is not limited to a physical or mechanical connection, but may include an electrical connection, whether directly or indirectly. "Up", "down", "left", "right", and the like are only used to indicate a relative location relationship, and when an absolute location of a described object changes, the relative location relationship may also change accordingly.

The foregoing descriptions are merely embodiments of the application, but are not intended to limit the application. Any modification, equivalent replacement, or improvement made without departing from the spirit and principle of the application should fall within the protection scope of the application.

What is claimed is:

1. A method for manufacturing a vertical interconnection structure, comprising:
   forming conductive pillars on a first surface of a substrate;
   forming a first insulated support layer on the first surface, wherein the conductive pillars are located in the first insulated support layer, the first insulated support layer comprises at least one of the following materials: amorphous silicon, polycrystalline silicon, silicon carbide, silicon nitride, boron nitride, silicon dioxide, aluminum nitride, and diamond, and wherein an upper surface of a conductive pillar that is away from the substrate is not covered by the first insulated support layer;
   removing the substrate; and
   before the forming the first insulated support layer on the first surface;
   forming a barrier layer, wherein the barrier layer covers a surface of the conductive pillar, and
   forming a dielectric layer on a surface of the barrier layer after the barrier layer is formed.

2. The manufacturing method according to claim 1, wherein the forming the conductive pillars on the first surface of the substrate comprises:
   forming a first photoresist layer on the first surface wherein there are through holes (40a) in the first photoresist layer (40);
   forming a first conductive material in the through holes of the first photoresist layer to form the conductive pillars; and
   removing the first photoresist layer located on the first surface.

3. The manufacturing method according to claim 2, wherein before the removing the first photoresist layer (40) located on the first surface (10a), the following process is performed at least once:
   forming a second photoresist layer on a surface of the first photoresist layer that is away from the substrate, wherein through holes of the second photoresist layer are in communication with the through holes of the first photoresist layer; and
   forming a second conductive material in the through holes of the second photoresist layer, to lengthen the conductive pillars.

4. The manufacturing method according to claim 1, wherein the forming the first insulated support layer on the first surface comprises:
   forming a second insulated support layer on the first surface, wherein the second insulated support layer covers the conductive pillars; and
   thinning the second insulated support layer to make the upper surface of the conductive pillar that is away from the substrate exposed to obtain the first insulated support layer.

5. The manufacturing method according to claim 1, wherein a thickness of the first insulated support layer is the same as a height of the conductive pillar.

6. The manufacturing method according to claim 1, wherein the first insulated support layer is formed through deposition.

7. The manufacturing method according to claim 1, wherein a length-to-diameter ratio of the conductive pillar is greater than 0 and is less than or equal to 20.

8. The manufacturing method according to claim 1, wherein a distance between the conductive pillars is from 5 μm to 100 μm.

9. A vertical interconnection structure, wherein the vertical interconnection structure is manufactured by using the following operations:
   forming conductive pillars on a first surface of a substrate;
   forming a first insulated support layer on the first surface, wherein the conductive pillars are located in the first insulated support layer, the first insulated support layer comprises at least one of the following materials: amorphous silicon, polycrystalline silicon, silicon carbide, silicon nitride, boron nitride, silicon dioxide, aluminum nitride, and diamond, and wherein an upper surface of a conductive pillar that is away from the substrate is not covered by the first insulated support layer;
   removing the substrate; and
   before the forming the first insulated support layer on the first surface;
   forming a barrier layer, wherein the barrier layer covers a surface of the conductive pillar, and
   forming a dielectric layer on a surface of the barrier layer after the barrier layer is formed.

10. A chip packaging method, comprising:
    forming conductive pillars on a first surface of a substrate;
    forming a first insulated support layer on the first surface, wherein the conductive pillars are located in the first insulated support layer, the first insulated support layer comprises at least one of the following materials: amorphous silicon, polycrystalline silicon, silicon carbide, silicon nitride, boron nitride, silicon dioxide, aluminum nitride, and diamond, and wherein an upper surface of a conductive pillar that is away from the substrate is not covered by the first insulated support layer;
    disposing a first die on a surface of the first insulated support layer that is away from the substrate;
    removing the substrate; and
    before the forming the first insulated support layer on the first surface,
    forming a barrier layer, wherein the barrier layer covers a surface of the conductive pillar, and
    forming a dielectric layer on a surface of the barrier layer after the barrier layer is formed.

11. The chip packaging method according to claim 10, wherein the disposing the first die on the surface of the first insulated support layer that is away from the substrate comprises:
    forming a first redistribution layer on the surface of the first insulated support layer that is away from the substrate, wherein a first metal layer in the first redistribution layer is electrically connected to the conductive pillar; and
    disposing the first die on the surface of the first redistribution layer that is away from the first insulated support layer, wherein the first die is electrically connected to the first metal layer.

12. The chip packaging method according to claim 10, further comprising:
    disposing a second die on the first surface of the substrate before the conductive pillars are formed on the first surface of the substrate; and
    forming the conductive pillars on a surface of the second die that is away from the substrate before the first insulated support layer is formed on the first surface, wherein the conductive pillars located on the surface of the second die are electrically connected to the second die; and the disposing a first die on a surface of the first insulated support layer that is away from the substrate comprises:
disposing two first dies that are spaced apart from each other on the surface of the first insulated support layer that is away from the substrate, wherein one of the first dies is connected to some of the conductive pillars, and the other first die is connected to the remaining conductive pillars, and each of the first dies is electrically connected to at least one conductive pillar located on the surface of the second die.

13. The chip packaging method according to claim 10, further comprising:
connecting a surface of the first insulated support layer that is away from the first die to a package substrate.

14. The chip packaging method according to claim 10, further comprising:
disposing a second redistribution layer on a surface of the first insulated support layer that is away from the first die, wherein a second metal layer in the second redistribution layer is electrically connected to the conductive pillar; and
connecting the second redistribution layer to a package substrate.

15. The chip packaging method according to claim 10, wherein the forming a first insulated support layer on the first surface comprises:
forming a second insulated support layer on the first surface, wherein the second insulated support layer covers the conductive pillars; and
thinning the second insulated support layer to make the upper surface of the conductive pillar that is away from the substrate exposed to obtain the first insulated support layer.

16. The chip packaging method according to claim 10, wherein a thickness of the first insulated support layer is the same as a height of the conductive pillar.

17. A packaged chip, wherein the packaged chip is packaged by using the following operations:
forming conductive pillars on a first surface of a substrate;
forming a first insulated support layer on the first surface, wherein the conductive pillars are located in the first insulated support layer, the first insulated support layer comprises at least one of the following materials: amorphous silicon, polycrystalline silicon, silicon carbide, silicon nitride, boron nitride, silicon dioxide, aluminum nitride, and diamond, and an upper surface of a conductive pillar that is away from the substrate is not covered by the first insulated support layer;
disposing a first die on a surface of the first insulated support layer that is away from the substrate;
removing the substrate; and
before the forming the first insulated support layer on the first surface;
forming a barrier layer, wherein the barrier layer covers a surface of the conductive pillar, and
forming a dielectric layer on a surface of the barrier layer after the barrier layer is formed.

\* \* \* \* \*